United States Patent

Segi et al.

Patent Number: 6,158,382
Date of Patent: Dec. 12, 2000

[54] METHOD FOR FORMING A DEPOSITED FILM BY PLASMA CHEMICAL VAPOR DEPOSITION AND APPARATUS FOR FORMING A DEPOSITED FILM BY PLASMA CHEMICAL VAPOR DEPOSITION

[75] Inventors: Yoshio Segi; Hiroyuki Katagiri; Yasuyoshi Takai, all of Nara, Japan

[73] Assignee: Canon Kabushiki Kaisha, Tokyo, Japan

[21] Appl. No.: 08/989,233

[22] Filed: Dec. 12, 1997

[30] Foreign Application Priority Data

Dec. 12, 1996 [JP] Japan .................................. 8-351841

[51] Int. Cl.$^7$ .................................................. C23C 16/00
[52] U.S. Cl. ........................... 118/723 E; 118/723 MP; 118/723 MW; 118/723 VE; 156/345 P; 156/345 C; 204/298.38
[58] Field of Search .................. 118/723 VE, 723 MP, 118/723 MW, 723 E; 156/345 P, 345 C; 204/298.38

[56] References Cited

U.S. PATENT DOCUMENTS

| 5,129,359 | 7/1992 | Takei et al. | 118/723 |
| 5,232,507 | 8/1993 | Ohtoshi et al. | 118/719 |
| 5,582,648 | 12/1996 | Katagiri et al. | 118/723 |

FOREIGN PATENT DOCUMENTS

| 58-030125A | 2/1983 | Japan . |
| 58-032413A | 2/1983 | Japan . |
| 59-213439A | 12/1984 | Japan . |
| 60-168156A | 8/1985 | Japan . |
| 60-178457A | 9/1985 | Japan . |
| 60-225854A | 11/1985 | Japan . |
| 61-231561A | 10/1986 | Japan . |
| 63-000479A | 1/1988 | Japan . |
| 63-007373A | 1/1988 | Japan . |
| 3044477A | 2/1991 | Japan . |

*Primary Examiner*—Nasser Ahmad
*Attorney, Agent, or Firm*—Fitzpatrick, Cella, Harper & Scinto

[57] ABSTRACT

A film-forming method by a plasma CVD process, comprising introducing a raw material gas into a reaction chamber containing a substrate positioned therein through a plurality of gas ejecting holes provided at a gas feed pipe and introducing a discharging energy into said reaction chamber to excite and decompose said film-forming raw material gas introduced into said reaction chamber whereby causing the formation of a deposited film on said substrate, characterized in that the introduction of said film-forming raw material gas into said reaction chamber is conducted by ejecting the film-forming raw material gas toward a member opposed to the substrate from each of right and left sides of the gas feed pipe through the gas ejecting holes of the gas feed pipe at a gas-ejecting angle (a) of $45° \leq (a) < 90°$ to a line which is passing through between said cylindrical substrate and each of said plurality of gas feed pipes.

25 Claims, 2 Drawing Sheets

METHOD FOR FORMING A DEPOSITED FILM BY PLASMA CHEMICAL VAPOR DEPOSITION AND APPARATUS FOR FORMING A DEPOSITED FILM BY PLASMA CHEMICAL VAPOR DEPOSITION

BACKGROUND OF THE INVENTION

1. Field of the Invention

The present invention relates to a method and an apparatus for the formation of a functional deposited film on a substrate by means of plasma chemical vapor deposition (hereinafter referred to simply as "plasma CVD"). More particularly, the present invention relates to a method for continuously forming a functional crystalline or non-single crystalline deposited film on a substrate by plasma CVD, the deposited film being usable as a semiconductor element for semiconductor devices, electrophotographic photosensitive devices (or electrophotographic light receiving members), photovoltaic devices, image input line sensors, image pickup devices, and thin-film transistors. The present invention also relates to an apparatus suitable for practicing said method.

2. Related Background Art

Heretofore, as the constituent element members of semiconductor devices, electrophotographic photosensitive devices (or electrophotographic light receiving members), image input line sensors, image pickup devices, or other electronic devices including optical devices, there have been proposed a number of non-single crystalline semiconductor deposited films. For example, an amorphous deposited film composed an amorphous silicon material compensated with hydrogen atoms (H) or/and halogen atoms (X) such as fluorine atoms or chlorine atoms [hereinafter referred to as "a-Si(H,X)"] and a number of crystalline semiconductor deposited films such as so-called diamond deposited thin films and polycrystalline silicon deposited thin films have been suggested. Some of these films have been put in practical use.

It is known that such semiconductor deposited films can be formed by means of a plasma CVD process in which a deposited film is formed on a substrate of glass, quartz, heat-resistant synthetic resin, stainless steel, or aluminum by decomposing a film-forming raw material gas with a glow discharge using a direct current (DC) energy, a high frequency energy or a microwave energy.

There have been proposed various film-forming apparatus suitable for practicing such plasma CVD process.

FIG. 1 is a schematic diagram illustrating a film-forming apparatus by a high-frequency plasma CVD process (this apparatus will be hereinafter referred to as high-frequency plasma CVD apparatus) as an example of such film-forming apparatus.

The high-frequency plasma CVD apparatus shown in FIG. 1 comprises a deposition system 2100 comprising a reaction chamber 2111 (or a deposition chamber) provided with means for evacuating the inside of the reaction chamber, and a raw material gas supply system 2200 for supplying raw material gas into the reaction chamber 2111.

The reaction chamber 2111 of the deposition system 2100 has a substantially enclosed reaction space. Reference numeral 2112 indicates a substrate (for instance, a cylindrical substrate) placed on a rotatable cylindrical substrate holder 2113 having an electric heater 2113' therein which is arranged in the reaction space of the reaction chamber 2111. In the reaction space of the reaction chamber 2111, there are installed a plurality of gas feed pipes 2114 each being provided with a plurality of openings (not shown) for feeding a raw material gas. The gas feed pipes 2114 are connected to a gas supply pipe 2116 provided with a sub-valve 2260, extending from the gas supply system 2200. The reaction chamber 2111 is provided with an exhaust pipe 2117 which is connected through a main valve 2118 to a vacuuming apparatus such as a vacuum pump (not shown). The exhaust pipe 2117 is provided with a leak valve 2117'. Reference numeral 2119 indicates a vacuum gage connected to the exhaust pipe 2117. Reference numeral 2115 indicates a high frequency matching box extending from a high frequency power source (not shown), being electrically coupled to the reaction chamber 2111.

The raw material gas supply system 2200 comprises gas reservoirs 2221 to 2226 respectively containing a given raw material gas, for instance, $SiH_4$ gas in the gas reservoir 2221, $GeH_4$ gas in the gas reservoir 2222, $H_2$ gas in the gas reservoir 2223, $CH_4$ gas in the gas reservoir 2224, $B_2H_6$ gas diluted with $H_2$ gas (hereinafter referred to as $B_2H_6$/H2 gas) in the gas reservoir 2225, and $PH_3$ gas diluted with $H_2$ gas (hereinafter referred to as $PH_3/H_2$ gas) in the gas reservoir 2226; valves 2231 to 2236 for the gas reservoirs 2221 to 2226; inlet valves 2241 to 2246; exit valves 2251 to 2256; and mass flow controllers 2111 to 2216. Each of reference numerals 2261 to 2266 indicates a pressure controller. Each of the gas reservoirs 2221 to 2226 is communicates with the gas feed pipes 2114 in the reaction chamber 2111 through the gas supply pipe 2116 provided with the sub-valve 2260.

Film formation using the plasma CVD apparatus shown in FIG. 1 is conducted, for example, in the following manner.

A cylindrical substrate 2112 on which a film is to be deposited is positioned on the substrate holder 2113 in the reaction chamber 2111, followed by evacuating the inside of the reaction chamber 2111 to a desired vacuum by means of a vacuum pump (not shown). The cylindrical substrate 2112 is heated to a desired temperature (for example, a temperature in the range of 20 to 450° C.) by actuating the heater 2113' and it is maintained at this temperature.

Prior to the entrance of film-forming raw material gases into the reaction space of the reaction chamber 2111, it is confirmed that valves 2231–2236 of the gas reservoirs 2221–2226 and the leak valve 2117' of the reaction chamber 2111 are closed and that the inlet valves 2241–2246, the exit valves 2251–2256 and the sub-valve 2260 are opened. Then, the main valve 2118 is opened and the vacuum pump (not shown) is actuated to evacuate the reaction space of the deposition chamber 2111 and the gas pipe ways. Upon observing that the reading on the vacuum gage 2119 became about $5\times10^{-6}$ Torr, the sub-valve 2260 and the exit valves 2251–2256 are closed. Thereafter, the valves 2231–2236 are opened to introduce the respective raw material gases from the gas reservoirs 2221–2226, and the pressures for the respective raw material gas are adjusted to 2 $Kg/cm^2$ by the pressure controllers 2261–2266. Then, the inlet valves 2241–2246 are gradually opened to introduce the respective raw material gases into the mass flow controllers 2211–2216.

After completing the preparation for the film formation as above described, the formation of a give layer on the cylindrical substrate 2112 is conducted, for example, in the following manner.

When the temperature of the cylindrical substrate 2112 becomes stable at a desired temperature, the exit valves 2251–2256 and the sub-valve 2260 are opens as necessary to introduce raw material gases from the gas reservoirs 2221–2226 into the reaction space of the reaction chamber 2111 through the gas feed pipes 2114. Then, the flow rate of each raw material gas is adjusted to a desired valve by the corresponding mass flow controllers 2211–2216. The inner pressure (the gas pressure) of the reaction space of the reaction chamber 2111 is adjusted to a predetermined valve of less than 1 Torr by regulating the opening of the main valve 2118 while observing the vacuum gage 2119. When the inner pressure of the reaction space of the reaction chamber 2111 became stable at the predetermined value, a high frequency power source with an oscillation frequency of 13.56 MHz (not shown) is switched on to apply a high frequency power into the reaction space of the reaction chamber 2111 through the high frequency matching box 2115. Glow discharge is generated to decompose the raw material gases introduced therein whereby causing the formation of a deposited film (for example, a deposited film containing silicon atoms as a matrix) on the cylindrical substrate 2112.

After the deposited film is formed at a desired thickness on the cylindrical substrate, the application of the high frequency power is suspended, and the exit valves are closed to suspend the introduction of the raw material gases into the reaction chamber. The formation of the deposited film is thus completed.

A layer having a multilayered structure can be formed by repeating the above film-forming procedures several times.

In the above film formation, it is a matter of course that all the exit valves other than those required for forming a given layer are closed. Further, after the formation of each layer, if necessary, the inside of the system is evacuated to a high vacuum by closing the exit valves 2251–2256 while opening the sub-valve 2260, and fully opening the main valve 2118 to avoid the gases used for the formation of the previous layer from remaining in the reaction chamber 2111 and in the pipe ways from the exit valves 2251–2256 to the inside of the reaction chamber 2111.

In the case of forming a large area deposited film, for instance, in the production of an electrophotographic photosensitive device (hereinafter referred to as "electrophotographic light receiving member"), in accordance with the foregoing manner, it is necessary for the large area deposited film to have a uniform thickness and a homogeneous film property. In order to achieve this, there are various proposals as will be described below.

Japanese Unexamined Patent Publication No. 213439/1984 discloses a technique in which a cylindrical electrode (which constitutes the circumferential wall of a reaction chamber having a discharge space in which a cylindrical substrate is positioned) is designed to serve also as means for introducing a raw material gas into the discharge space and a plurality of gas ejecting holes are arranged at the wall face of the cylindrical electrode so that the raw material gas can be uniformly introduced into the discharge space, whereby improving the uniformity of the thickness and film property for a deposited film formed on the cylindrical substrate.

Japanese Unexamined Patent Publication No. 44477/1991 discloses a technique where a cylindrical electrode is arranged at a position concentric to a cylindrical substrate arranged in a discharge space of a cylindrical reaction chamber. The cylindrical electrode is designed to serve also as means for introducing a raw material gas into the discharge space and a plurality of gas ejecting holes are arranged at the wall face of the cylindrical electrode at a rate of hole area in the range of 0.1 to 2.0%. A deposited film formed on the cylindrical substrate is prevented from having a pile-like protrusion therein, which will cause a defective image when an electrophotographic light receiving member comprising a deposited film having such pile-like protrusion is subjected to electrophotographic image formation.

Japanese Unexamined Patent Publication No. 30125/1983 discloses a technique where the introduction of a raw material gas into a cylindrical reaction chamber (which serves as an electrode) having a discharge space in which a cylindrical substrate is positioned is conducted by a plurality of gas feed pipes arranged outside the cylindrical substrate in the reaction chamber (specifically, in the discharge space). Each of the gas feed pipes is being provided with a plurality of gas ejecting holes (for introducing the raw material gas toward the cylindrical substrate) such that the cross-sectional area of each gas ejecting hole and the interval between each adjacent gas ejecting holes are varied in the longitudinal direction of the cylindrical substrate so as to uniformly feed the raw material gas into toward the cylindrical substrate in the discharge space. Thus, a deposited film having a uniform thickness on the cylindrical substrate is formed. The deposited film is capable of providing an electrophotographic light receiving member which can prevent an uneven image from occurring in the electrophotographic image formation.

Japanese Unexamined Patent Publication No. 32413/1983 discloses a technique where a cylindrical electrode (comprising the circumferential wall of a cylindrical reaction chamber having a discharge space in which a cylindrical substrate is positioned) serves also as means for introducing a raw material gas into the discharge space or the case where the introduction of a raw material gas into the discharge space is conducted by a plurality of gas feed pipes arranged outside the cylindrical substrate in the reaction chamber (specifically, in the discharge space). A plurality of gas ejecting holes are arranged at cylindrical electrode or the each of the gas feed pipes so that the raw material gas fed can rotate in a predetermined direction, thereby improving the uniformity of the thickness of a deposited film formed on the cylindrical substrate.

Japanese Unexamined Patent Publication No. 479/1988 discloses a technique where the introduction of a raw material gas into a cylindrical reaction chamber having a discharge space in which a cylindrical substrate is positioned is conducted by a gas feed pipe provided with a plurality of gas ejecting holes; and the angles of the gas ejecting holes of the gas feed pipe to the cylindrical substrate, the inner diameter of the cylindrical electrode, and the inner diameter of the cylindrical substrate are specified so that an improvement can be made in the uniformity of the thickness and property of a deposited film formed on the cylindrical substrate without rotating the cylindrical substrate during the film formation.

Japanese Unexamined Patent Publication No. 7373/1988 discloses a technique where the introduction of a raw material gas into a cylindrical reaction chamber having a discharge space in which a cylindrical substrate is positioned by a plurality of gas feed pipes, each being provided with a plurality of gas ejecting holes. The numerical interrelations between the cross section of each of the gas feed pipes and the cross sections of the gas ejecting holes are specified so that an improvement can be made in the uniformity of the thickness and property of a deposited film formed on the cylindrical substrate without rotating the cylindrical substrate during the film formation.

In accordance with these techniques, it is possible to produce an electrophotographic light receiving member having a light receiving layer comprising a deposited film with an improvement in the uniformity of the thickness and film property at a reasonable yield.

However, the electrophotographic light receiving member still has several points required to be further improved in order for it to have further improved overall characteristics.

Particularly, in recent years, electrophotographic apparatus in which an electrophotographic light receiving member is used have been rapidly progressed to have a high driving speed, an improved image-reproducing performance capable of providing a high quality image at a high speed, and a prolonged durability. Specifically, an improvement has been made in the optical exposure instrument, development instrument and transfer instrument used in the electrophotographic apparatus.

In addition, in recent years, there is a societal demand for further improving the quality of an image reproduced by the electrophotographic apparatus.

In view of this, for the electrophotographic light receiving member, there is an increased demand for further improving it so as to be compatible with such advanced electrophotographic apparatus and to satisfy the above societal demand. As a consequence, the electrophotographic light receiving member, is required to further improve its electric and photoconductive properties and to further progress such that it exhibits a further improved image-forming performance under any environmental use conditions while satisfactorily maintaining charge retentivity and photosensitivity.

Under this circumstance, in accordance with the foregoing techniques, it is possible to attain an electrophotographic light receiving member having a light receiving layer satisfactory in terms of the uniformity in the thickness and property to a certain extent and which can meet the above requirements to a certain extent. However, in view of further improving the quality of an image reproduced, the electrophotographic light receiving member is not always satisfactory. Particularly, for an amorphous silicon series electrophotographic light receiving member, there still is a demand for forming a high quality amorphous silicon deposited film having more uniform thickness and more uniform property as its light receiving layer and which effectively prevents the occurrence of a minute defects in reproduced image. In order to achieve this demand, it is necessary to at least make the flow rate of a raw material gas and the film deposition rate in the film-forming chamber upon the formation of the amorphous silicon deposited film uniform. Besides, there is an occasion such that foreign matter such as polysilane, which is deposited on the inner wall face of the film-forming chamber during the film formation, is removed to fly on a substrate on which a film is being deposited whereby contaminating the film, where the film is abnormally grown. When the film thus abnormally grown is used as a light receiving layer of an electrophotographic light receiving member, the electrophotographic light receiving member has a tendency to cause a minute defect in a reproduced image. Therefore, it is necessary to prevent such foreign matter, i.e., polysilane, from flying to the substrate during the film formulation.

SUMMARY OF THE INVENTION

The present invention is aimed at solving the foregoing problems in the conventional film-forming methods and apparatus and satisfying the foregoing demand for providing a desirable electrophotographic light receiving member.

Another object of the present invention is to provide a film-forming method by plasma CVD (hereinafter referred to as "plasma CVD film-forming method") and a film-forming apparatus by plasma CVD (hereinafter referred to as "plasma CVD film-forming apparatus") which effectively stabilize the flow of a raw material gas in the reaction chamber (the film-forming chamber) upon film formation so that a high quality deposited film having a uniform thickness and a uniform property and which can be markedly diminish the occurrence of a defect in an image reproduced when it is used as the light receiving layer of an electrophotographic light receiving member.

A further object of the present invention is to provide a plasma CVD film-forming apparatus which improves the characteristics, deposition rate, and reproducibility of a deposited film and also improves the yield of said film when it is mass-produced.

A further object of the present invention is to provide a plasma CVD film-forming method comprising the steps of: positioning a cylindrical substrate on a cylindrical substrate holder in a reaction chamber for a deposition chamber) of a plasma CVD apparatus; introducing a film-forming raw material gas into said reaction chamber through a plurality of gas feed pipes spacedly arranged on a coaxial circumference to said cylindrical substrate and along the longitudinal direction of said cylindrical substrate; and introducing a discharging energy into said reaction chamber to excite and decompose said film-forming raw material gas introduced into said reaction chamber thereby causing the formation of a deposited film on said cylindrical substrate. The introduction of said film-forming raw material gas into said reaction chamber is conducted by ejecting said film-forming raw material gas toward a member opposed to said cylindrical substrate from each of the right and left sides of each of said plurality of gas feed pipes at an angle (a) of 45°≦(a)<90° to a line which is passing through between said cylindrical substrate and each of said plurality of gas feed pipes.

[The "right side" and "left side" of the feed pipe are meant those sides when viewed from the side of the cylindrical substrate positioned in the reaction chamber.]

A further object of the present invention is to provide a plasma CVD film-forming apparatus comprising a substantially enclosed reaction chamber having a circumferential wall capable of serving also as an electrode; means for positioning a cylindrical substrate in said reaction chamber while supporting said cylindrical substrate thereon; a plurality of gas feed pipes for introducing a film-forming raw material gas into said reaction chamber, said plurality of gas feed pipes being spacedly arranged on a coaxial circumference to said cylindrical substrate and along the longitudinal direction of said cylindrical substrate; means for introducing a discharging energy into said reaction chamber for exciting and decomposing said film-forming raw material gas; and means for evacuating the inside of said reaction chamber; wherein each of said plurality of gas feed pipes has at least a gas ejecting hole with a gas-ejecting angle (a) of 45°≦(a) <90° against said circumferential wall of said reaction chamber on each of right and left sides of said gas feed pipe.

A further object of the present invention is to provide a plasma treating method comprising the steps of: arranging a substrate to be subjected to plasma treatment in a reaction chamber; introducing a gas into said reaction chamber through a gas feed pipe having a plurality of gas ejecting holes spacedly arranged along the longitudinal direction thereof, said gas feed pipe being arranged along said substrate; and effecting an energy to said gas introduced into said reaction chamber to generate a plasma whereby treating said substrate with said plasma generated; wherein the introduction of said gas into said reaction chamber is conducted by putting said plurality of gas ejecting holes in right and left sides of said gas feed pipe such that the gas is ejected on either sides at an angle of 45° or more to less than 90° to a direction toward a plane opposed to the substrate.

A further object of the present invention is to provide a plasma treating apparatus comprising a reaction chamber whose inside is capable of being vacuumed; a substrate installation means for installing a substrate to be subjected to plasma treatment in said reaction chamber; a gas feed pipe for introducing a gas into said reaction chamber, said gas feed pipe having a plurality of gas ejecting holes spacedly arranged along the longitudinal direction thereof and said gas feed pipe being arranged along a surface of said substrate positioned on said substrate installation means; an electrode used for effecting an energy to said gas introduced into said reaction chamber to generate plasma in said reaction chamber; wherein said plurality of gas ejecting holes of said gas feed pipe are arranged to eject said gas at an angle of 45° or more to less than 90° to a direction toward a plane opposed to the substrate.

DESCRIPTION OF THE INVENTION AND PREFERRED EMBODIMENTS

Figure 1:
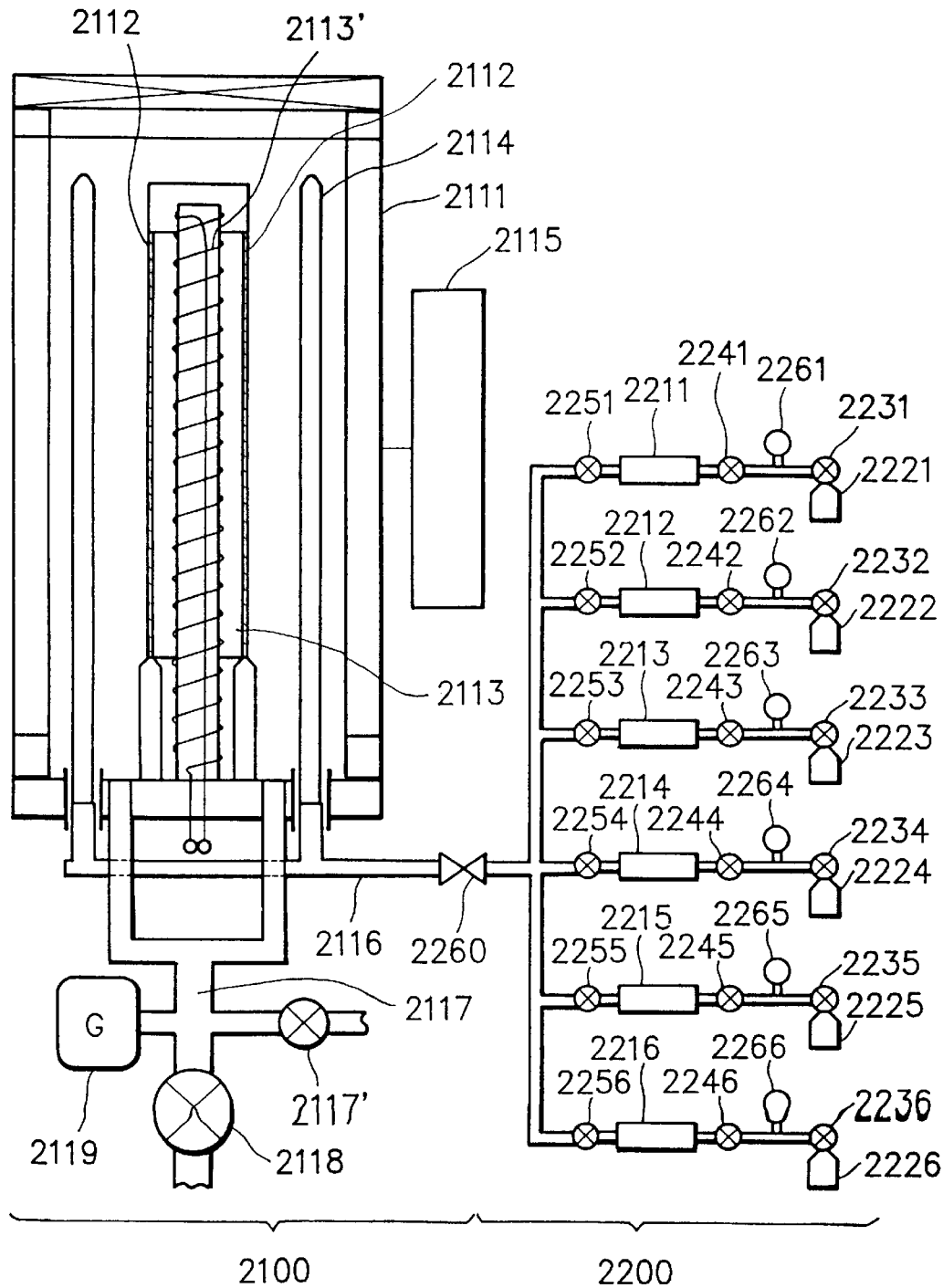
FIG. 1 is a schematic diagram illustrating the constitution an example of a plasma CVD apparatus.

In order to solve the foregoing problems in the prior art and in order to attain the above described objects, the present inventors conducted extensive studies through experiments. As a result, there were obtained such findings as will be described in the following. For the gas feed pipe having a plurality of gas ejecting holes which is used for introducing a gas (typically, a film-forming raw material gas) into the reaction chamber (or the deposition chamber) upon the formation of a deposited film on a substrate positioned in the reaction chamber by plasma CVD, when the gas ejecting angles of the gas ejecting holes of the gas feed pipe in relation to a member (such as a counter electrode opposed to the substrate, typically, the circumferential wall of the reaction chamber) which is opposed to the substrate are defined to fall in a specific range and these gas ejecting holes are provided on each of right and left sides of the gas feed pipe, a high quality deposited film having a uniform thickness and a homogeneous film property can be effectively formed on the substrate. An electrophotographic light receiving member prepared using this deposited film markedly diminish the occurrence of defects in a reproduced image.

The present invention has been accomplished based on these findings.

The present invention is directed to a plasma CVD film-forming method and a plasma CVD film-forming apparatus in which a gas feed pipe having a plurality of gas ejecting holes configured as above described.

A typical embodiment of the plasma CVD film-forming method according to the present invention comprises the steps of: positioning a cylindrical substrate on a cylindrical substrate holder in a reaction chamber (or a deposition chamber) of a plasma CVD apparatus; introducing a film-forming raw material gas into said reaction chamber through a plurality of gas feed pipes spacedly arranged on a coaxial circumference to said cylindrical substrate and along the longitudinal direction of said cylindrical substrate; and introducing a discharging energy into said reaction chamber to excite and decompose said film-forming raw material gas introduced into said reaction chamber, thereby causing the formation of a deposited film on said cylindrical substrate; wherein the introduction of said film-forming raw material gas into said reaction chamber is conducted by ejecting said film-forming raw material gas toward a member opposed to said cylindrical substrate from each of right and left sides (viewed from the cylindrical substrate side) of each of said plurality of gas feed pipes through the gas ejecting holes of the gas feed pipe at an angle (a) of preferably $45°≦(a)<90°$ or more preferably $70°≦(a)≦85°$ to a line which passes through between said cylindrical substrate and each of said plurality of gas feed pipes. Particularly, said line passes a center of said cylindrical substrate and a center of each of said plurality of gas feed pipes.

A typical embodiment of the plasma CVD film-forming according to the present invention comprises a substantially enclosed reaction chamber having a circumferential wall capable of serving also as an electrode; means for positioning a cylindrical substrate in said reaction chamber while supporting said cylindrical substrate thereon; a plurality of gas feed pipes for introducing a film-forming raw material gas into said reaction chamber, said plurality of gas feed pipes being spacedly arranged on a coaxial circumference to said cylindrical substrate and along the longitudinal direction of said cylindrical substrate; means for introducing a discharging energy into said reaction chamber for exciting and decomposing said film-forming raw material gas; and means for evacuating the inside of said reaction chamber; wherein each of said plurality of gas feed pipes has at least a gas ejecting hole with a gas-ejecting angle (a) of preferably $45°≦(a)<90°$ or more preferably $70°≦(a)≦85°$ against said circumferential wall of said reaction chamber on each of right and left sides (viewed from the cylindrical substrate side) of said gas feed pipe.

In the present invention, each of the gas feed pipes may have one or more gas ejecting holes having a gas-ejecting angle (a) of preferably $45°≦(a)<90°$ or more preferably $70°≦(a)≦85°$ on each of right and left sides of the gas feed pipe such that the gas ejecting hole on one side is symmetrical to that on the other side. Alternatively, each of the gas feed pipes may have one or more gas ejecting holes having a gas-ejecting angle (a) of preferably $45°≦(a)<90°$ or more preferably $70°≦(a)≦85°$ on each of right and left sides of the gas feed pipe such that the gas ejecting hole on one side is asymmetrical to that on the other side.

Now, a result of experimental studies, the present inventors obtained the following findings.

In the case where a gas feed pipe having a plurality of gas ejecting holes and which is independent from the reaction chamber (or the deposition chamber) is used, being different from the case where the reaction chamber is designed to serve also as a gas introduction means, there is an advantage in that as the gas ejecting holes are not situated at a circumferential wall portion of the reaction chamber, the introduction of a raw material gas into the reaction chamber can be conducted while preventing a polysilane previously deposited on the wall face of the reaction chamber from floating. And when the gas ejecting holes of the gas feed pipe are designed to have such gas-ejecting angle (a) as above described, the advantage is markedly improved such that the introduction of the raw material gas into the reaction chamber can be more effectively conducted while effectively preventing the polysilane previously deposited on the wall face of the reaction chamber from floating.

However, even in the case where the gas feed pipe having the plurality of gas ejecting holes is independently used as above described, there is an occasion where the flow of the raw material gas is relatively localized on the side of the circumferential wall of the reaction chamber to float the polysilane deposited on the circumferential wall of the reaction chamber and as a result, a resulting electrophotographic light receiving member is liable to provide defects in a reproduced image, when the gas-ejecting angles (a) of the gas ejecting holes are less than the foregoing range. When the gas-ejecting angles (a) of the gas ejecting holes are beyond the foregoing range, the flow of the raw material gas can be relatively localized on the side of the cylindrical substrate to cause a variation in the concentration distribution of the raw material gas in the reaction chamber and as a result, glow discharge is unevenly generated to form a deposited film on the cylindrical substrate, which is uneven in the thickness and charge potential in the circumferential direction of the cylindrical substrate.

On the other hand, when the gas ejecting holes provided at the gas feed pipe are designed to have the gas-ejecting angle (a) in the foregoing range, such problems as above described are effectively prevented from occurring and it is possible to effectively form a high quality deposited film having a uniform thickness and a homogeneous film property which enables production of desirable electrophotographic light receiving member which markedly diminishes the occurrence of defects in an reproduced image.

When the gas ejecting holes provided at the gas feed pipe are designed to have the gas-ejecting angle (a) in the foregoing range and they are symmetrically arranged on the right and left sides of the gas feed pipe, the concentration distribution of the raw material gas introduced into the reaction chamber is uniform. As a result, a high quality deposited film can be formed on the cylindrical substrate, which is even in the thickness and charge potential in the circumferential direction of the cylindrical substrate.

When the gas ejecting holes provided at the gas feed pipe are designed to have the gas-ejecting angle (a) in the foregoing range and they are asymmetrically arranged on the right and left sides of the gas feed pipe, a high quality deposited film can be formed on the cylindrical substrate while desirable preventing the occurrence of a defect in the film.

Further, by making the gas ejecting holes provided at the gas feed pipe have the gas-ejecting angle (a) in the foregoing range, the concentration distribution of the raw material gas introduced into the reaction chamber is uniform and the glow discharge is uniformly generated in the reaction chamber. This situation enables production of desirable electrophotographic light receiving member having a marked improvement particularly in charge retentivity.

The present invention is based on these findings.

In the following, the present invention will be described in more detail with reference to the drawings.

Figure 2:
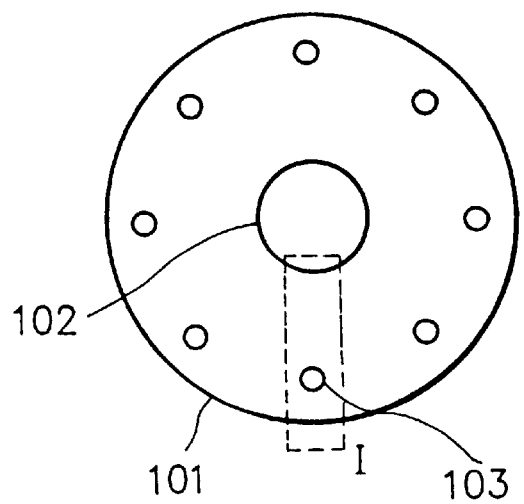
FIG. 2 is a schematic cross-sectional view illustrating an example of a reaction chamber in a plasma CVD apparatus according to the present invention.

FIG. 2 is a schematic cross-sectional view illustrating a principal part of an example of a plasma CVD film-forming apparatus according to the present invention.

For the plasma CVD film-forming apparatus shown in FIG. 2, other constitutions other than those shown in FIG. 2 are corresponding to those shown in FIG. 1.

In FIG. 2, reference numeral 101 indicates a cylindrical reaction chamber having a substantially enclosed reaction space (or a film-forming discharge space) hermetically formed by an upper wall, a circumferential wall serving also as an electrode, and a lower wall. Reference numeral 102 indicates a cylindrical substrate held on a cylindrical substrate holder (not shown). The cylindrical substrate 102 is arranged in the reaction space of the reaction chamber 101 concentrically with the circumferential wall of the reaction chamber, where the cylindrical substrate is designed to serve as a counter electrode to the electrode comprising the circumferential wall of the reaction chamber.

Reference number 103 indicates a gas feed pipe for introducing a raw material gas into the reaction space of the reaction chamber 101. In FIG. 2, a plurality of gas feed pipes 103 are spacedly arranged (at an equal interval and an equal installation angle in the figure) on a coaxial circumference to the cylindrical substrate 102 and along the longitudinal direction (that is, the axial direction) of the cylindrical substrate between the two electrodes (that is, between the cylindrical substrate and the circumferential wall of the reaction chamber) in the reaction space.

Figure 3:
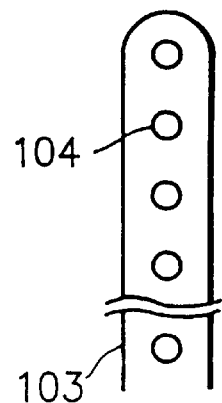
FIG. 3 is a schematic view illustrating a gas feed pipe in a plasma CVD apparatus according to the present invention.

As shown in FIG. 3, each of the gas feed pipes 103 is provided with a plurality of gas ejecting holes 104 at its side wall such that they are spacedly arranged along the longitudinal direction of the gas feed pipe.

Figure 4:
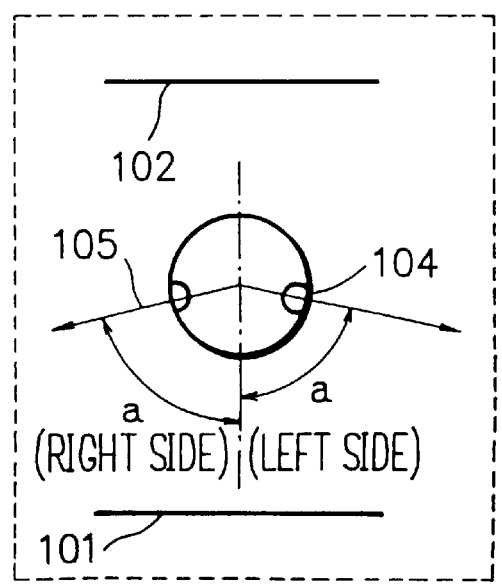
FIG. 4 is a schematic view for explaining a position at which a gas ejecting hole is arranged at a gas feed pipe in a plasma CVD apparatus according to the present invention.

FIG. 4 is a schematic view illustrating the opening directions of the gas ejecting holes 104 provided at the gas feed pipe 103. Particularly, FIG. 4 is a schematically enlarged view of a part indicated by I in FIG. 2.

Reference numeral 105 in FIG. 4 indicates a gas ejecting direction. In FIG. 4, each of the reaction chamber 101 (specifically, the circumferential wall of the reaction chamber) and the cylindrical substrate 102 are shown respectively by a straight line.

As FIG. 4 illustrates, the gas ejecting holes 104 are arranged on the right and left sides of the gas feed pipe 103 so as to have an angle a (or a gas-ejecting angle) of $45° \leq a < 90°$ toward the circumferential wall of the reaction chamber 101. The "a" will be hereinafter referred to as "(a)".

The angle (a) herein means an angle formed by a dashed straight line which is extending while intersecting the center of a cross section (including the gas ejecting hole) of the gas feed pipe which is provided by cutting the inside space of the gas feed pipe in a direction perpendicular or substantially perpendicular to the direction of the raw material gas flow in the inside space of the gas feed pipe and a solid straight lien 105 which is extending from the center of said cross section toward the circumferential wall of the reaction chamber while intersecting the center of the gas ejecting hole 104 (see, FIG. 4).

Particularly in this respect, the gas ejecting hole 104 is arranged at the gas feed pipe 103 so as to have a gas-ejecting angle (a) in the above angle range on the basis of a straight line which perpendicularly or substantially perpendicularly intersects (i) the center of a cross section of the inside space of the gas feed pipe, which is provided by cutting the inside space of the gas feed pipe in a direction intersect the direction of the raw material gas to flow therein, and (ii) the center of the substrate or the circumferential wall of the reaction chamber which opposes the substrate. In other words, the gas ejecting hole 104 is arranged at the gas feed pipe 103 such that the gas ejecting hole is never directly opened toward the substrate but makes it possible to eject a raw material gas at a prescribed angle toward the circumferential wall of the reaction chamber or a member opposed to the substrate.

In the case where the reaction chamber is designed not to function as an electrode and as the counter electrode to the substrate, a given counter electrode which is independent from the reaction chamber (which forms a vacuum atmosphere) is used, the arrangement of the gas ejecting hole at the gas feed pipe should be appropriately determined having due care about the interrelations among the counter electrode, the gas ejecting hole, and the substrate. Particularly in this respect, the gas ejecting hole is appropriately arranged at the gas feed pipe such that the gas ejecting hole ejects a raw material at a prescribed angle in a direction which faces toward the circumferential wall or a given plane opposed to the substrate.

The direction for the raw material gas to be ejected from the gas ejecting hole herein means a principal ejecting direction of the raw material gas at the time when the raw material gas is released from the gas ejecting hole. In general, it may be considered as a straight line which connects the center of the gas ejecting hole with the center of the passage (or the space) in the gas feed pipe.

The number of the gas feed pipes 103 arranged in a peripheral region of the cylindrical substrate 102, it is eight in FIG. 2. This is not limitative. It should be appropriately determined depending upon the related factors including the size of the reaction chamber, the size of the cylindrical substrates, the number of the cylindrical substrate arranged in the reaction chamber, and the like. However, in general, it is desired to be four to twelve.

In the following description will be made of the formation of a deposited film in the present invention.

The substrate used for the formation of a deposited film in the present invention may either be electrically conductive or electrically insulative.

The electrically conductive substrate can include, for example, metals such as Al, Cr, Mo, Au, In, Nb, Te, V, Ti, Pt, Pd, and Fe, and alloys of these metals such as stainless steels.

The electrically insulative substrate can include, for example, films or sheets of synthetic resins such as polyester, polyethylene, polycarbonate, cellulose acetate, polypropylene, polyvinylchloride, polystyrene and polyamide, glass, and ceramics. Any of these films and sheets are desired to be applied with electroconductive treatment to at least a surface thereof on which a deposited film as a light receiving layer of an electrophotographic light receiving member is to formed. In this case, the remaining surface may be also applied with electroconductive treatment.

The substrate may be a cylindrical form or a plate-like endless belt form, having a flat or irregular surface.

The thickness of the substrate, should be properly determined so that a desired electrophotographic light receiving member can be produced. In the case where flexibility is required for the light receiving member, it can be made as thin as possible within a range capable of sufficiently providing the function as the substrate. However, the thickness is usually made to be greater than 10 $\mu$m in view of the fabrication and handling or mechanical strength of the substrate.

It is possible for the substrate to have an uneven surface. For instance, in the case where image formation is conducted using coherent monochromatic light such as laser beams, the substrate may have an uneven surface provided with irregularities in order to prevent the occurrence of defective images caused by a so-called interference fringe pattern being apt to appear in a visible image formed. Such uneven surface of the substrate may be formed by a conventional manner described in Japanese Unexamined Patent Publications Nos. 168156/1985, 178457/1985, and 225854/1985.

The irregularities of the uneven surface of the substrate may be based on a plurality of spherical dimples. Particularly, the irregularities may comprise a plurality of spherical dimples whose sizes are smaller than the resolution required for an electrophotographic light receiving member. The formation of the irregularities based on such spherical dimples at a surface of the substrate may be conducted by a conventional manner described in Japanese Unexamined Patent Publication No. 231561/1986.

In order to form, for instance, an amorphous silicon (a-Si) deposited film using the plasma CVD film-forming apparatus according to the present invention, basically, a raw material gas capable of supplying silicon atoms (Si) and a raw material gas capable of supplying hydrogen atoms (H) or/and a raw material gas capable of supplying halogen atoms (X) respectively in a desired gaseous state are introduced into the reaction chamber in which a substrate on which a deposited film is to be formed is positioned, and a high frequency power is introduced into the reaction chamber to generate glow discharge in the raw material gases introduced therein thereby causing the formation of a deposited film comprising a-Si: (H,X) on the substrate.

The raw material capable of supplying Si can include, for example, gaseous or gasifiable silicon hydrides (silanes). Specific examples are $SiH_4$, $Si_2H_6$, $Si_3H_8$, $Si_4H_{10}$, etc. Of these, $SiH_4$ and $Si_2H_6$ are particularly preferred in view of the easy layer forming work and the good efficiency for the supply of Si. These Si-supplying materials may be used either singly or in combination of two or more of them.

In order to structurally introduce hydrogen atoms (H) into a deposited film while readily controlling the amount of the hydrogen atoms to be introduced into the deposited film, it is effective to conduct the film formation by mixing a desired amount of $H_2$ gas or/and He gas, or a gaseous silicon compound containing hydrogen atoms with the foregoing Si-supplying gaseous raw material.

As the raw material capable of supplying the halogen atoms (X), there can be mentioned gaseous or gasifiable halogen compounds such as gaseous halogen, halides, inter-halogen compounds, and hydrogenated silicon compounds containing halogen atoms, namely, halogen-substituted silane derivatives. Preferably examples are fluorine gas ($F_2$) as such gaseous halogen; BrF, ClF, $ClF_2$, $BrF_3$, $IF_3$, and $IF_7$ as such inter-halogen compound; and $SiF_4$ and $Si_2F_6$ as such halogen-substituted silane derivative.

Control of the amount of the hydrogen atoms (H) or/and that of the halogen atoms (X) to be contained in the deposited film may be conducted by controlling a related factor such as the temperature of the substrate, the amount of the gaseous raw material capable of supplying hydrogen atoms (H) or/and halogen atoms (X) to be introduced into the reaction chamber, or the discharging power.

If necessary, the deposited film may contain atoms of a conductivity controlling element (hereinafter referred to as conductivity controlling atoms).

In this case, the deposited film may contain the conductivity controlling atoms such that they are uniformly distributed in the entire region or such that they are unevenly distributed in a partial region in the film thickness direction.

As the conductivity controlling element, so-called impurities the semiconductor field can be mentioned, and those usable herein can include elements belonging to group IIIb of the periodic table which provide a p-type conductivity (hereinafter simply referred to as group IIIb element) and elements belonging to group Vb of the periodic table which provide an n-type conductivity (hereinafter simply referred to as group Vb element).

Specific examples of the group IIIb elements are B, Al, Ga, In, and Tl. Of these elements, B, Al and Ga are particularly preferable. Specific examples of the group Vb elements are P, As, Sb, and Bi. Of these elements, P and As are particularly preferable.

The amount of the conductivity controlling atoms contained in the deposited film, is preferably in the range of from $1\times10^{-2}$ to $1\times10^4$ atomic ppm, more preferably in the range of from $5\times10^{-2}$ to $5\times10^3$ atomic ppm, or most preferably in the range of from $1\times10^{-2}$ to $1\times10^3$ atomic ppm.

The structural introduction of atoms of a given conductivity controlling element, specifically, atoms of a given group IIIb element (these atoms will be hereinafter referred to as group IIIb atoms) or atoms of a given Vb element (these atoms will be hereinafter referred to as group Vb atoms) into the deposited film may be conducted by introducing, in addition to the gaseous raw materials for the formation of the deposited film, a gaseous raw material capable of supplying the group IIIb or Vb atoms into the reaction chamber upon the formation of the deposited film.

Such group IIIb or Vb atom-supplying raw material can include raw materials capable of supplying group IIIb or Vb atoms, which are in the gaseous state at room temperature or can be easily gasified at least under the conditions for the formation of the deposited film.

Such group IIIb atom-supplying gaseous or gasifiable raw material can include boron hydrides such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$, and $BBr_3$. Additionally, $AlCl_3$, $GaCl_3$, $Ga(CH_3)_3$, $InCl_3$, and $TlCl_3$ are also usable.

Such group Vb atom-supplying gaseous or gasifiable raw material can include phosphorus hydrides such as $PH_3$ and $P_2H_4$; and phosphorus halides such as $PH_4I$, $PF_3$, $PF_5$, $PCl_3$, $PCl_5$, $PBr_3$, $PBr_5$, and $PI_3$. Further, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable.

Any of the above mentioned raw materials may be diluted with $H_2$ gas, He gas or a mixture of these gases, if necessary, upon the introduction thereof into the reaction chamber.

In order to form a deposited film having desired properties, it is desired to adequately adjust the mixing ratio between the Si-supplying raw material gas and the dilution gas, the gaseous pressure in the reaction chamber, the discharging power, and the substrate temperature, (Ts).

The flow rate of the dilution gas (comprising $H_2$ gas, He gas, or a mixture of these gases), its optimum range should be determined in accordance with a previously established layer design. However, in general, the flow rate of the dilution gas is desired to be preferably in the range of 1 to 20 times, more preferably in the range of 3 to 15 times, most preferably in the range of 5 to 10 times, respectively versus the flow rate of the Si-supplying raw material gas.

For the gaseous pressure in the reaction chamber, its optimum range should be also determined in accordance with the previously established layer design. However, in general, it is desired to be preferably in the range of $1\times10^{-4}$ to 10 Torr, more preferably in the range of $5\times10^{-4}$ to 5 Torr, most preferably in the range of $1\times10^{-3}$ to 1 Torr.

For the discharging power, its optimum range should be also determined in accordance with the previously established layer design. However, in general, it is designed to be preferably in the range of 0.1 to 7 times, more preferably in the range of 0.5 to 6 times, most preferably in the range of 0.7 to 5 times, respectively versus the flow rate of the Si-supplying raw material gas.

For the substrate temperature (Ts), its optimum range should be also determined in accordance with the previously established layer design. However, in general, it is desired to be in the range of 200 to 350° C.

However, the actual conditions for forming the desired deposited, film such as the substrate temperature and the gaseous pressure in the reaction chamber, cannot usually be easily determined independent of each other. Accordingly, the conditions optimal to the film formation are desirably determined based on relative and organic relationships for forming a deposited film having desired properties.

In the following, the features and advantages of the present invention will be described in more detail with reference to examples, but the scope of the present invention is not restricted by these examples.

EXAMPLE 1

In this example, the plasma CVD apparatus shown in FIGS. 2 to 4 was used in combination with FIG. 1, in which the cylindrical substrate holder is made of aluminum and has a length of 1000 mm. Eight gas feed pipes are spacedly arranged as shown in FIG. 3. Each of these gas feed pipes is being provided with 20 gas ejecting holes of 0.5 mm in diameter on each of the right and left sides along the longitudinal direction such that the 40 gas ejecting holes on the right and left sides are symmetrically placed to have a given gas-ejecting angle (a) (see, Table 2) against the circumferential wall of the cylindrical reaction chamber.

A cylindrical substrate made of aluminum of 358 mm in length and 108 mm in outer diameter and having a well-cleaned mirror-finished surface was positioned on the cylindrical substrate holder of the plasma CVD apparatus. Then, a charge injection inhibition layer, a photoconductive layer and a surface layer were sequentially formed on the mirror-finished surface of the cylindrical substrate under the conditions shown in Table 1 to obtain an electrophotographic light receiving member.

The above procedures for the preparation of the electrophotographic light receiving member were repeated eleven times, except that the 40 gas ejecting holes of 0.5 mm in diameter symmetrically arranged on the right and left sides of each gas feed pipe were made to have a given gas-ejecting angle (a) selected from the group consisting of 10°, 30°, 45°, 60°, 70°, 75°, 80°, 82.5°, 85°, 87.5°, and 90° (see, Table 2) against the circumferential wall of the cylindrical reaction chamber in each case.

In this way, there were obtained eleven electrophotograph is light receiving member samples A to K (see, Table 2).

Comparative Example 1

1. The procedures for the preparation of the electrophotographic light receiving member sample K in Example 1 were repeated to obtain an electrophotographic light receiving member sample (1).

2. An electrophotographic light receiving member sample (2) was prepared in the same manner as in Example 1 except that eight gas feed pipes each having 20 gas ejecting holes on only one side along the longitudinal direction such that they are spacedly arranged so as to face toward the circumferential wall of the cylindrical reaction chamber and each of the gas ejecting holes was designed to have a size of 0.7 mm in diameter in order to mate the amount of the raw material gas ejected into the reaction chamber with that in Example 1.

Evaluation

For the eleven electrophotographic light receiving member samples A to K obtained in Example 1 and the two electrophotographic light receiving member samples (1) and (2) obtained in Comparative Example 1, evaluation was conducted with respect to unevenness in film thickness distribution in the circumference direction, unevenness in charge potential in the circumference direction, the number of defects, and charge retentivity (CR) in the following manner. Based on the results of these items, a total evaluation was conducted.

The results obtained are collectivity shown in Table 2.

1. Evaluation of the unevenness in the film thickness distribution:

For each electrophotographic light receiving member sample, the film thickness was measured along the circumference direction of the sample. A mean value among the measured values was obtained. The evaluated result is shown in Table 2 on the basis of the following criteria.

⊚: a case where a variation from the mean value is 3% or less;
○: a case where a variation from the mean value is 5% or less;
Δ: a case where a variation from the mean value is 10% or less; and
X: a case where a variation from the mean value is beyond 10%

2. Evaluation of the unevenness in the charge potential:

Each electrophotographic light receiving member sample was set to an electrophotographic apparatus NP6150 modified for experimental purposes (produced by Canon Kabushiki Kaisha), where the charge potential in the circumference direction of the sample was measured. A mean value among the measured values was obtained. The evaluated result is shown in Table 2 on the basis of the following criteria.

⊚: a case where a variation from the mean value is 3% or less;
○: a case where a variation from the mean value is 5% or less;
Δ: a case where a variation from the mean value is 10% or less; and
X: a case where a variation from the mean value is beyond 10%.

3. Evaluation of the number of defect:

For each electrophotographic light receiving member sample, the number of defects present in a given area of 9 cm$^2$ was examined by using an optical microscope of 50 times in magnification. The result is shown in Table 2 on the basis of the following criteria.

⊚: a case where the number of defects of 20 μm or more in size is less than 20;
○: a case where the number of defects of 20 μm or more in size is 20 or more;
Δ: a case where several defects of 50 μm or more in size which will cause defective images are present; and
X : a case where a number of defects of 50 μm or more in size which will cause defective images are present.

4. Evaluation of the charge retentivity:

Each electrophotographic light receiving member sample was set to an electrophotographic apparatus NP6150 modified for experimental purposes (produced by Canon Kabushiki Kaisha), where the charge potential in the circumference direction of the sample was measured.

The measured result for the electrophotographic light receiving member sample 1) obtained in Comparative Example 1 is set at 100 in charge retentivity (CR) for the comparison purpose, which is shown in Table 2. For the charge retentivity (CR) of each of the remaining electrophotographic light receiving member samples, it is shown in Table 2 on the basis of the following criteria.

⊚: a case where the charge retentivity is 105<CR≦110;
○: a case where the charge retentivity is 100≦CR≦105;
Δ: a case where the charge retentivity is 95≦CR<100; and
X: a case where the charge retentivity is 95>CR.

5. Total Evaluation:

Based on the evaluated results in the above evaluations 1 to 4 for each electrophotographic light receiving member sample, total evaluation was conducted.

The result obtained is shown in Table 2 on the basis of the following criteria.

⊚: a case where the totally evaluated result is very good;
○: a case where the totally evaluated result is good;
Δ: a case where the totally evaluated result is not good but is not problematic in practice; and
X: a case where the totally evaluated result is inferior and is problematic in practice.

Based on the results shown in Table 2, it was found that when a plurality of feed pipes each having a plurality of gas ejecting holes on each of the right and left sides along the longitudinal direction such that they are symmetrically arranged so as to have a specific gas-ejecting angle (a) of 45°≦(a)<90° or preferably 70°≦(a)≦85° against the circumferential wall of the cylindrical reaction chamber are spacedly arranged, a deposited film having satisfactory properties can be effectively formed.

EXAMPLE 2

In this example, the procedures of Example 1 were repeated, except for changing the arrangement of the gas ejecting holes as will be described in the following Example 2-1 and Example 2-2.

Example 2-1

There was used the plasma CVD apparatus shown in FIGS. 2 to 4 in combination with FIG. 1 in which the cylindrical substrate holder is made of aluminum and has a length of 1000 mm. Eight gas feed pipes are spacedly arranged as shown in FIG. 3. Each of these gas feed pipes is provided with 20 gas ejecting holes of 0.5 mm in diameter on each of the right and left sides along the longitudinal direction such that the 40 gas ejecting holes on the right and left sides are asymmetrically placed where the 20 gas ejecting holes on the left side have a fixed gas ejecting angle of 80° against the circumferential wall of the cylindrical reaction chamber and the 20 gas ejecting holes on the right side have a given gas ejecting angle (a) (which is different from the former) against the circumferential wall of the cylindrical reaction chamber.

A cylindrical substrate made of aluminum of 358 mm in length and 108 mm in outer diameter and having a well-cleaned mirror-finished surface was positioned on the cylindrical substrate holder of the plasma CVD apparatus. Then, a charge injection inhibition layer, a photoconductive layer and a surface layer were sequentially formed on the mirror-finished surface of the cylindrical substrate under the conditions shown in Table 1 to obtain an electrophotographic light receiving member.

The above procedures for the preparation of the electrophotographic light receiving member were repeated eleven times, except that the 20 gas ejecting holes arranged on the right side of each gas feed pipe were made to have a given gas-ejecting angle (a) selected from the group consisting of 10°, 30°, 45°, 60°, 70°, 75°, 80°, 82.5°, 85°, 87.5°, and 90° (see, Table 3) against the circumferential wall of the cylindrical reaction chamber in each case.

In this way, there were obtained eleven electrophotographic light receiving member samples A to K (see, Table 3).

Example 2-2

The plasma CVD apparatus shown in FIGS. 2 to 4 was used in combination with FIG. 1 in which the cylindrical substrate holder is made of aluminum and has a length of 1000 mm, and eight gas feed pipes are spacedly arranged as shown in FIG. 3. Each of these gas feed pipes is provided with 20 gas ejecting holes of 0.5 mm in diameter on each of the right and left sides along the longitudinal direction such that the 40 gas ejecting holes on the right and left sides are asymmetrically place where the 20 gas ejecting holes on the right side have a fixed gas ejecting angle of 80° against the circumferential wall of the cylindrical reaction chamber and the 20 gas ejecting holes on the left side have a given gas ejecting angle (a) (which is different from the former) against the circumferential wall of the cylindrical reaction chamber.

A cylindrical substrate made of aluminum of 358 mm in length and 108 mm in outer diameter and having a well-cleaned mirror-finished surface was positioned on the cylindrical substrate holder of the plasma CVD apparatus. Then, a charge injection inhibition layer, a photoconductive layer and a surface layer were sequentially formed on the mirror-finished surface of the cylindrical substrate under the conditions shown in Table 1 to obtain an electrophotographic light receiving member.

The above procedures for the preparation of the electrophotographic light receiving member were repeated eleven times, except that the 20 gas ejecting holes arranged on the left side of each gas feed pipe were made to have a given gas-ejecting angle (a) selected from the group consisting of 10°, 30°, 45°, 60°, 70°, 75°, 80°, 82.5°, 85°, 87.5°, and 90° (see, Table 4) against the circumferential wall of the cylindrical reaction chamber in each case.

In this way, there were obtained eleven electrophotographic light receiving member samples A to K (see, Table 4).

Evaluation

For the eleven electrophotographic light receiving member samples A to K obtained in Example 2-1, evaluation was conducted with respect to unevenness in film thickness distribution in the circumference direction, unevenness in charge potential in the circumference direction, the number of defects, and charge retentivity (CR) in the same manner as in Example 1. And based on the results of these items, a total evaluation was conducted. The results obtained are collectively shown in Table 3.

For the eleven electrophotographic light receiving member samples A to K obtained in Example 2-2, evaluation was conducted with respect to unevenness in film thickness distribution in the circumference direction, unevenness in charge potential in the circumference direction, the number of defects, and charge retentivity (CR) in the same manner as in Example 1. And based on the results of these items, a total evaluation was conducted. The results obtained are collectively shown in Table 4.

Based on the results whose in Tables 3 and 4, it was found that even when a plurality of feed pipes each having a plurality of gas ejecting holes spacedly on the right and left sides along the longitudinal direction such that the gas ejecting holes on one side are asymmetrical to those on the other side, where the former have a fixed gas ejecting angle against the circumferential wall of the cylindrical reaction chamber and the letter have a specific gas ejecting angle (a) of $45° \leq (a) < 90°$ or preferably $70° \leq (a) \leq 85°$ against the circumferential wall of the cylindrical reaction chamber are spacedly arranged, a deposited film having satisfactory properties can be effectively formed.

EXAMPLE 3

In this example, the plasma CVD apparatus shown in FIGS. 2 to 4 in combination with FIG. 1 was used in which the cylindrical substrate holder is made of aluminum and has a length of 1000 mm, and eight gas feed pipes are spacedly arranged as shown in FIG. 3. Each of these gas feed pipes is provided with 20 gas ejecting holes of 0.5 mm in diameter on each of the right and left sides along the longitudinal direction such that the 40 gas ejecting holes on the right and left sides are symmetrically placed to have a gas-ejecting angle of 80° against the circumferential wall of the cylindrical reaction chamber.

A cylindrical substrate made of aluminum of 358 mm in length and 108 mm in outer diameter and having a well-cleaned mirror-finished surface was positioned on the cylindrical substrate holder of the plasma CVD apparatus. Then, a charge injection inhibition layer, a photoconductive layer and a surface layer were sequentially formed on the mirror-finished surface of the cylindrical substrate under the conditions shown in Table 5 to obtain an electrophotographic light receiving member having a three-layered light receiving layer comprising a charge injection inhibition layer, a photoconductive layer and a surface layer.

For the resultant electrophotographic light receiving member, evaluation was conducted with respect to unevenness in film thickness distribution in the circumference direction, unevenness in charge potential in the circumference direction, the number of defect, and charge retentivity (CR) in the same manner as in Example 1. As a result, the electrophotographic light receiving member was found to be satisfactory with respect to all the evaluation items.

EXAMPLE 4

In this example, the procedures of each of Examples 2-1 and 2—2 were repeated, except for changing the arrangement of the gas ejecting holes as will be described in the following Example 4-1 and Example 4-2.

EXAMPLE 4-1

The plasma CVD apparatus shown in FIGS. 2 to 4 in combination with FIG. 1 was used in which the cylindrical substrate holder is made of aluminum and has a length of 1000 mm. Eight gas feed pipes are spacedly arranged as shown in FIG. 3. Each of these gas feed pipes is provided with 20 gas ejecting holes of 0.5 mm in diameter on each of the right and left sides along the longitudinal direction such that the 40 gas ejecting holes on the right and left sides are asymmetrically placed where the 20 gas ejecting holes on the left side have a gas-ejecting angle of 80° against the circumferential wall of the cylindrical reaction chamber and the 20 gas ejecting holes on the right side have a gas-ejecting angle of 70° against the circumferential wall of the cylindrical reaction chamber.

A cylindrical substrate made of aluminum of 358 mm in length and 108 mm in outer diameter and having a well-cleaned mirror-finished surface was positioned on the cylindrical substrate holder of the plasma CVD apparatus. Then, a charge injection inhibition layer, a photoconductive layer and a surface layer were sequentially formed on the mirror-finished surface of the cylindrical substrate under the conditions shown in Table 5 to obtain an electrophotographic light receiving member having a three-layered light receiving layer comprising a charge injection inhibition layer, a photoconductive layer and a surface layer.

EXAMPLE 4-2

The plasma CVD apparatus shown in FIGS. 2 to 4 in combination with FIG. 1 was used in which the cylindrical substrate holder is made of aluminum and has a length of 1000 mm. Eight gas feed pipes are spacedly arranged as shown in FIG. 3. Each of these gas feed pipes is provided with 20 gas ejecting holes of 0.5 mm in diameter on each of the right and left sides along the longitudinal direction such that the 40 gas ejecting holes on the right and left sides are asymmetrically placed where the 20 gas ejecting holes on the right side have a gas-ejecting angle of 80° against the circumferential wall of the cylindrical reaction chamber and the 20 gas ejecting holes on the left side have a gas-ejecting angle of 70° against the circumferential wall of the cylindrical reaction chamber.

A cylindrical substrate made of aluminum of 358 mm in length and 108 mm in outer diameter and having a well-cleaned mirror-finished surface was positioned on the cylindrical substrate holder of the plasma CVD apparatus. Then, a charge injection inhibition layer, a photoconductive layer and a surface layer were sequentially formed on the mirror-finished surface of the cylindrical substrate under the conditions shown in Table 5 to obtain an electrophotographic light receiving member having a three-layered light receiving layer comprising a charge injection inhibition layer, a photoconductive layer and a surface layer.

Evaluation

For each of the two electrophotographic light receiving members obtained in Examples 4-1 and 4-2, evaluation was conducted with respect to unevenness in film thickness distribution in the circumference direction, unevenness in charge potential in the circumference direction, the number of defects, and charge retentivity (CR) in the same manner as in Example 1. As a result, these two electrophotographic light receiving members were found to be satisfactory with respect to all the evaluation items.

EXAMPLE 5

The procedures of Example 3 were repeated, except that the film-forming conditions were changed to those shown in Table 6, to obtain an electrophotographic light receiving member having a four-layered light receiving layer comprising a charge injection inhibition layer, a charge transportation layer, a charge generation layer, and a surface layer being stacked in the named order on the cylindrical substrate.

For the resultant electrophotographic light receiving member, evaluation was conducted with respect to unevenness in film thickness distribution in the circumference direction, unevenness in charge potential in the circumference direction, the number of defects, and charge retentivity (CR) in the same manner as in Example 1. As a result, the electrophotographic light receiving member was found to be satisfactory with respect to all the evaluation items.

EXAMPLE 6

The procedures of each of Examples 4-1 and 4-2 in Example 4 were repeated except that the film-forming conditions were changed to those shown in Table 6 in each case, whereby two electrophotographic light receiving members each having a four-layered light receiving layer comprising a charge injection inhibition layer, a charge transportation layer, a charge generation layer, and a surface layer being stacked in the named order on the cylindrical substrate.

For each of the resultant two electrophotographic light receiving members, evaluation was conducted with respect to unevenness in film thickness distribution in the circumference direction, unevenness in charge potential in the circumference direction, the number of defects, and charge retentivity (CR) in the same manner as in Example 1. As a result, these two electrophotographic light receiving members were found to be satisfactory with respect to all the evaluation items.

EXAMPLE 7

The procedures of Example 3 were repeated, except that the film-forming conditions were changed to those shown in Table 7, to obtain an electrophotographic light receiving member having a five-layered light receiving layer comprising a charge injection inhibition layer, a charge transportation layer, a charge generation layer, an intermediate layer and a surface layer being stacked in the named order on the cylindrical substrate.

For the resultant electrophotographic light receiving member, evaluation was conducted with respect to unevenness in film thickness distribution in the circumference direction, unevenness in charge potential in the circumference direction, the number of defects, and charge retentivity (CR) in the same manner as in Example 1. As a result, the electrophotographic light receiving member was found to be satisfactory with respect to all the evaluation items.

EXAMPLE 8

The procedures of each of Examples 4-1 and 4-2 in Example 4 were repeated, except that the film-forming conditions were changed to those shown in Table 7 in each case, whereby two electrophotographic light receiving members each having a five-layered light receiving layer comprising a charge injection inhibition layer, a charge transportation layer, a charge generation layer, an intermediate layer and a surface layer being stacked in the named order on the cylindrical substrate.

For each of the resultant two electrophotographic light receiving members, evaluation was conducted with respect to unevenness in film thickness distribution in the circumference direction, unevenness in charge potential in the circumference direction, the number of defects, and charge retentivity (CR) in the same manner as in Example 1. As a result, these two electrophotographic light receiving members were found to be satisfactory with respect to all the evaluation items.

EXAMPLE 9

The procedures of Example 3 were repeated, except that the film-forming conditions were changed to those shown in Table 8, to obtain an electrophotographic light receiving member having a three-layered light receiving layer comprising a charge injection inhibition layer, a photoconductive layer and a surface layer being stacked in the named order on the cylindrical substrate.

For the resultant electrophotographic light receiving member, evaluation was conducted with respect to unevenness in film thickness distribution in the circumference direction, unevenness in charge potential in the circumference direction, the number of defects, and charge retentivity (CR) in the same manner as in Example 1. As a result, the electrophotographic light receiving member was found to be satisfactory with respect to all the evaluation items.

EXAMPLE 10

The procedures of each of Example 4-1 and 4-2 in Example 4 were repeated except that the film-forming conditions were changed to those shown in Table 8 in each case, whereby two electrophotographic light receiving members each having a three-layered light receiving layer comprising a charge injection inhibition layer, a photoconductive layer and a surface layer being stacked in the named order on the cylindrical substrate.

For each of the resultant two electrophotographic light receiving members, evaluation was conducted with respect to unevenness in film thickness distribution in the circumference direction, unevenness in charge potential in the circumference direction, the number of defects, and charge retentivity (CR) in the same manner as in Example 1. As a result, these two electrophotographic light receiving members were found to be satisfactory with respect to all the evaluation items.

As apparent from the above description, according to the present invention for the gas feed pipe having a plurality of gas ejecting holes which is used for introducing a raw material gas (typically, a film-forming raw material gas) into the reaction chamber (or the deposition chamber) for the formation of a deposited film on a substrate positioned in the reaction chamber by plasma CVD, the gas-ejecting angles of the gas ejecting holes of the gas feed pipe in relation to a member (such as a counter electrode opposed to the substrate, typically, the circumferential wall of the reaction chamber) which is opposed to the substrate are defined to fall in a specific range. When these gas ejecting holes are provided on each of right and left sides of the gas feed pipe, the concentration distribution of the raw material gas introduced into the reaction chamber is stabilized. Because of this, it is possible to effectively form a high quality deposited film having a uniform thickness distribution and a homogeneous property and which has a markedly improved evenness in terms of charge potential. This enables effective production of a desirable electrophotographic light receiving member which can continuously and stably reproduce a high quality image.

In addition, the formation of a silicon-containing deposited film can be efficiently conducted while effectively preventing foreign matter such as polysilane (which will cause a minute defect in an image reproduced when an electrophotographic light receiving member having a light receiving layer comprising a silicon-containing deposited film contaminated with such foreign mater is subjected to electrophotographic image formation) which has been deposited on the circumferential wall of the reaction chamber in the previous film formation, where it is possible to efficiently form a high quality silicon-containing deposited film (specifically, a high quality amorphous silicon deposited film) which can be desirably used as a light receiving layer of an electrophotographic light receiving member. This situation desirably complies with the demand for providing an improved amorphous silicon series electrophotographic light receiving member which continuously and stably reproduce a high quality image.

Further, the present invention enables to mass production of improved amorphous silicon series electrophotographic light receiving member at a markedly improved yield.

TABLE 1

| conditions | name of layer | | |
|---|---|---|---|
| | charge injection inhibition layer | photo-conductive layer | surface layer |
| gas used and its flow rate | | | |
| $SiH_4$ [sccm] | 100 | 500 | 10 |
| $H_2$ [sccm] | 300 | 800 | |
| $B_2H_6$ [ppm] (against $SiH_4$) | 2000 | 2 | |
| NO [sccm] | 50 | | |
| $CH_4$ [sccm] | | | 500 |
| substrate temperature [° C.] | 290 | 290 | 290 |
| inner pressure (gas pressure) [Torr] | 0.5 | 0.5 | 0.5 |
| discharging power (high frequency) [W] | 200 | 500 | 300 |
| layer thickness [μm] | 3 | 30 | 0.5 |

TABLE 2

| Sample No. | Example 1 | | | | | | | | | | | Comparative Example 1 | |
|---|---|---|---|---|---|---|---|---|---|---|---|---|---|
| | A | B | C | D | E | F | G | H | I | J | K | (1) | (2) |
| angle of gas spouting hold [°] | 10 | 30 | 45 | 60 | 70 | 75 | 80 | 82.5 | 85 | 87.5 | 90 | (90) | (0) |
| unevenness in film thickness distribution | ○ | ○ | ○ | ○ | ◎ | ◎ | ◎ | ◎ | ◎ | ○ | ○ | ○ | ○ |
| unevenness in charge potential | Δ | ○ | ◎ | ◎ | ◎ | ◎ | ◎ | ◎ | ◎ | ◎ | Δ | Δ | Δ |
| number of defects | Δ | Δ | ○ | ○ | ◎ | ◎ | ◎ | ◎ | ◎ | ○ | ○ | ○ | Δ |
| charge retentivity | Δ | Δ | ○ | ◎ | ◎ | ◎ | ◎ | ◎ | ◎ | ○ | ○ | 100 | Δ |
| total evaluation | Δ | Δ | ○ | ○ | ◎ | ◎ | ◎ | ◎ | ◎ | ○ | Δ | Δ | Δ |

TABLE 3

| | Example 2-① | | | | | | | | | | |
|---|---|---|---|---|---|---|---|---|---|---|---|
| Sample No. | A | B | C | D | E | F | G | H | I | J | K |
| angle of the gas spouting hole on the right side [°] | 10 | 30 | 45 | 60 | 70 | 76 | 77.5 | 82.5 | 85 | 87.5 | 90 |
| unevenness in film thickness distribution | ○ | ○ | ○ | ○ | ◎ | ◎ | ◎ | ◎ | ◎ | ○ | ○ |
| unevenness in charge potential | Δ | ○ | ○ | ○ | ◎ | ◎ | ◎ | ◎ | ◎ | ○ | Δ |
| number of defects | Δ | ○ | ◎ | ◎ | ◎ | ◎ | ◎ | ◎ | ◎ | ◎ | ○ |
| charge retentivity | Δ | Δ | ○ | ◎ | ◎ | ◎ | ◎ | ◎ | ◎ | ○ | ○ |
| total evaluation | Δ | Δ | ○ | ○ | ◎ | ◎ | ◎ | ◎ | ◎ | ○ | Δ |

TABLE 4

| | Example 2-② | | | | | | | | | | |
|---|---|---|---|---|---|---|---|---|---|---|---|
| Sample No. | A | B | C | D | E | F | G | H | I | J | K |
| angle of the gas spouting hole on the left side [°] | 10 | 30 | 45 | 60 | 70 | 75 | 77.5 | 82.5 | 85 | 87.5 | 90 |
| unevenness in film thickness distribution | ○ | ○ | ○ | ○ | ◎ | ◎ | ◎ | ◎ | ◎ | ○ | ○ |
| unevenness in charge potential | Δ | ○ | ○ | ○ | ◎ | ◎ | ◎ | ◎ | ◎ | ○ | Δ |
| number of defects | Δ | ○ | ◎ | ◎ | ◎ | ◎ | ◎ | ◎ | ◎ | ◎ | ○ |
| charge retentivity | Δ | Δ | ○ | ◎ | ◎ | ◎ | ◎ | ◎ | ◎ | ○ | ○ |
| total evaluation | Δ | Δ | ○ | ○ | ◎ | ◎ | ◎ | ◎ | ◎ | ○ | Δ |

TABLE 5

| | name of layer | | |
|---|---|---|---|
| conditions | charge injection inhibition layer | photo-conductive layer | surface layer |
| gas used and its flow rate | | | |
| SiH$_4$ [sccm] | 100 | 200 | 150 → 15 → 10 |
| H$_2$ [sccm] | 300 | 800 | |
| B$_2$H$_6$ [ppm] (against SiH$_4$) | 2000 | 2 | |
| NO [sccm] | | | |
| CH$_4$ [sccm] | 50 | | 0 → 500 → 600 |
| substrate temperature [° C.] | 290 | 290 | 290 |
| inner pressure (gas pressure) [Torr] | 0.5 | 0.5 | 0.5 |
| discharging power (high frequency) [W] | 500 | 800 | 300 |
| layer thickness [μm] | 3 | 30 | 0.5 |

TABLE 6

| | name of layer | | | |
|---|---|---|---|---|
| conditions | charge injection inhibition layer | charge trans-portation layer | charge generation layer | surface layer |
| gas used and its flow rate | | | | |

TABLE 6-continued

| | name of layer | | | |
|---|---|---|---|---|
| conditions | charge injection inhibition layer | charge trans-portation layer | charge generation layer | surface layer |
| SiH$_4$ [sccm] | 200 | 300 | 100 | 30 |
| H$_2$ [sccm] | 500 | 1000 | 600 | |
| B$_2$H$_6$ [ppm] (against SiH$_4$) | | 5 → 1 | 1 | 5 |
| PH$_3$ [ppm] (against SiH$_4$) | 500 | | | |
| CO$_2$ [sccm] | 0.5 | 0.5 | 0.1 | 0.1 |
| CH$_4$ [sccm] | 20 | 100 → 1 | 0.1 | 500 |
| substrate temperature [° C.] | 250 | 250 | 250 | 250 |
| inner pressure (gas pressure) [Torr] | 0.3 | 0.5 | 0.5 | 0.2 |
| discharging power (high frequency) [W] | 100 | 600 | 500 | 300 |
| layer thickness [μm] | 3 | 30 | 2 | 0.5 |

TABLE 7

| conditions | charge injection inhibition layer | charge transportation layer | charge generation layer | intermediate layer | surface layer |
|---|---|---|---|---|---|
| gas used and its flow rate | | | | | |
| SiHi [sccm] | 200 | 300 | 100 | 30 | 30 |
| $H_2$ [sccm] | 500 | 1000 | 600 | | |
| $B_2H_6$ [ppm] (against $SiH_4$) | | 5→1 | 1 | 300 | 5 |
| $PH_3$ [ppm] (against $SiH_4$) | 500 | | | | |
| $CO_7$ [sccm] | 0.5 | 0.5 | 0.1 | 0.1 | 0.1 |
| $CH_4$ [sccm] | 20 | 100→0 | 0.1 | 200 | 500 |
| substrate temperature [° C.] | 250 | 250 | 250 | 250 | 250 |
| igner pressure (gas pressure) [Torr] | 0.3 | 0.5 | 0.5 | 0.2 | 0.2 |
| discharging power (high frequency) [W] | 100 | 600 | 500 | 200 | 300 |
| layer thickness [μm] | 3 | 30 | 2 | 0.1 | 0.5 |

TABLE 8

| conditions | charge injection inhibition layer | photo-conductive layer | surface layer |
|---|---|---|---|
| gas used and its flow rate | | | |
| $SiH_4$ [sccm] | 390 | 430 | 186 → 168 → 30 → 25 |
| $H_2$ [sccm] | 780 | 2150 | |
| $B_2H_6$ [ppm] (against $SiH_4$) | 1500 | 1.25 | |
| NO [sccm] | 13 | | |
| $CH_4$ [sccm] | | | 752 → 847 → 1487 → 1527 |
| substrate temperature [° C.] | 250 | 270 | 250 |
| inner pressure (gas pressure) [Torr] | 0.3 | 0.55 | 0.3 → 0.45 |
| discharging power (high frequency) [W] | 320 | 700 | 250 |
| layer thickness [μm] | 3 | 30 | 0.7 |

What is claimed is:

1. A film-forming method by a plasma CVD process, comprising the steps of:

positioning a cylindrical substrate on a cylindrical substrate holder in a reaction chamber, introducing a film-forming raw material gas into said reaction chamber through a plurality of gas feed pipes spacedly arranged on a coaxial circumference to said cylindrical substrate and along the longitudinal direction of said cylindrical substrate, and introducing a discharging energy into said reaction chamber to excite and decompose said film-forming raw material gas introduced into said reaction chamber thereby causing the formation of a deposited film on said cylindrical substrate, wherein the introduction of said film-forming raw material gas into said reaction chamber is conducted by ejecting said film-forming raw material gas toward a member opposed to said cylindrical substrate from each of right and left sides of each of said plurality of gas feed pipes through the gas ejecting holes of the gas feed pipe at a gas-ejecting angle (a) of 45°≦(a)<90° to a line which is passing through between said cylindrical substrate and each of said plurality of gas feed pipes.

2. A film-forming method according to claim 1, wherein the line is passing a center of the cylindrical substrate and a center of each of the gas feed pipes.

3. A film-forming method according to claim 1, wherein ejection of the raw material gas at the angle (a) from the right and left sides of each of gas feed pipes is conducted such that the raw material gas ejected on the both sides is symmetrical to said line.

4. A film-forming method according to claim 1, wherein ejection of the raw material gas at the angle (a) from the right and left sides of each of the gas feed pipes is conducted such that the raw material gas ejected on both sides is asymmetrical to said line.

5. A film-forming apparatus by a plasma CVD process, comprising a substantially enclosed reaction chamber having a circumferential wall capable of serving also as an electrode, means for positioning a cylindrical substrate in said reaction chamber while supporting said cylindrical substrate thereon, a plurality of gas feed pipes for introducing a film-forming raw material gas into said reaction chamber, said plurality of gas feed pipes being spacedly arranged on a coaxial circumference to said cylindrical substrate and along the longitudinal direction of said cylindrical substrate, means for introducing a discharging energy into said reaction chamber for exciting and decomposing said film-forming raw material gas introduced into said reaction chamber, and means for evacuating the inside of said reaction chamber, wherein each of said plurality of gas feed pipes has at least a gas ejecting hole with a gas-ejecting angle (a) of 45°≦(a)<90° against said circumferential wall of said reaction chamber on each of right and left sides of said gas feed pipe.

6. A film-forming apparatus according to claim 5, wherein the gas ejecting holes having a gas-ejecting angle (a) of 45°≦(a)<90° against said circumferential wall of said reaction chamber which are provided on the right and left sides of each of the gas feed pipes are arranged in a symmetrical state.

7. A film-forming apparatus according to claim 5, wherein the gas ejecting holes having a gas-ejecting angle (a) of 45°≦(a)<90° against said circumferential wall of said reaction chamber which are provided on the right and left sides of each of the gas feed pipes are arranged in an asymmetrical state.

8. A plasma treating method comprising the steps of:

positioning a substrate in a reaction chamber, introducing a gas into said reaction chamber through at least a gas feed pipe having a plurality of gas ejecting holes along the longitudinal direction thereof, said gas feed pipe being arranged along said substrate, and applying an energy to said gas introduced into said reaction chamber to generate a plasma whereby treating said substrate with said plasma generated, wherein the introduction of said gas into said reaction chamber is conducted by putting said plurality of gas ejecting holes of said gas feed pipe in the right and left sides of said gas feed pipe such that the gas is ejected on either sides at an angle of 45° or more to less than 90° to a direction toward a plane opposed to the substrate.

9. A plasma treating method according to claim 8, wherein the plane opposed to the substrate is an electrode.

10. A plasma treating method according to claim 8, wherein the substrate is in a cylindrical form.

11. A plasma treating method according to claim 8, wherein the energy comprises a high frequency energy.

12. A plasma treating method according to claim 8, wherein the substrate is in a cylindrical form and the gas feed pipe comprises a plurality of gas feed pipes which are spacedly arranged at an equal interval around the substrate.

13. A plasma treating method according to claim 8, wherein the substrate is in a cylindrical form, the gas feed pipe comprises a plurality of gas feed pipes, the reaction chamber has an internal face which is concentric with the substrate, and said plurality of gas feed pipes are spacedly arranged at a position of drawing a concentric circle corresponding to the cylindrical form of the substrate in the reaction chamber.

14. A plasma treating method according to claim 8, wherein the gas includes a raw material gas for the formation of a deposited film on the substrate.

15. A plasma treating method according to claim 8, wherein ejection of the gas into the reaction chamber from the right and left sides of the gas feed pipe is conducted in a symmetrical state to the direction toward the plane opposed to the substrate.

16. A plasma treating method according to claim 8, wherein ejection of the gas into the reaction chamber from the right and left sides of the gas feed pipe is conducted in a asymmetrical state to the direction toward the plane opposed to the substrate.

17. A plasma treating method according to claim 8, wherein the direction toward the plane opposed to the substrate is substantially perpendicular to said plane.

18. A plasma treating method according to claim 14, wherein the deposited film contains silicon atoms.

19. A plasma treating apparatus comprising an evacuable reaction chamber; a substrate installation means for installing a substrate in said reaction chamber while supporting said substrate thereon; a gas feed pipe for introducing a gas into said reaction chamber, said gas feed pipe being provided with a plurality of gas ejecting holes along the longitudinal direction thereof and said gas feed pipe being arranged along a surface of said substrate positioned on said substrate installation means; and an electrode used for applying an energy to said gas introduced into said reaction chamber to generate a plasma in said reaction chamber; wherein said plurality of gas ejecting holes of said gas feed pipe are arranged so as to eject said gas at an angle of 45 degrees or more to less than 90 degrees to a direction toward a plane opposed to the substrate.

20. A plasma treating apparatus according to claim 19, wherein the substrate is in a cylindrical form, and the reaction chamber has an internal wall which is concentric with the substrate.

21. A plasma treating apparatus according to claim 19, wherein the electrode constitutes at least a part of the reaction chamber.

22. A plasma treating apparatus according to claim 19, wherein the gas feed pipe comprises a plurality of gas feed pipes which are spacedly arranged at an equal interval around the substrate.

23. A plasma treating apparatus according to claim 20, wherein the gas feed pipe comprises a plurality of gas feed pipes which are spacedly arranged on a concentric circle corresponding to the cylindrical form of the substrate in the reaction chamber.

24. A plasma treating apparatus according to claim 19, wherein the gas ejecting holes of the gas feed pipes are arranged at positions of the gas feed pipe which are symmetrical to the plane.

25. A plasma treating apparatus according to claim 19, wherein the gas ejecting holes of the gas feed pipes are arranged at positions of the gas feed pipe which are asymmetrical to the plane.

* * * * *

UNITED STATES PATENT AND TRADEMARK OFFICE
CERTIFICATE OF CORRECTION

PATENT NO.   : 6,158,382
DATED        : December 12, 2000
INVENTOR(S)  : Yoshio Segi et al.

It is certified that error appears in the above-identified patent and that said Letters Patent is hereby corrected as shown below:

<u>Title page,</u>
Item [56], FOREIGN PATENT DOCUMENTS "3044477A    2/1991    Japan" should read -- 3044477A    2/1991    Japan --.

<u>Column 1,</u>
Line 31, "composed" should read -- composed of --;
Line 37, "put in" should read -- put into --.

<u>Column 2,</u>
Line 9, "gage" should read -- gauge --;
Line 26, "is communicates" should read -- communicates --;
Line 48, "gage" should read -- gauge --;
Line 65, "opens" should read -- opened --.

<u>Column 3,</u>
Line 5, "valve" should read -- value --;
Line 7, "gage" should read -- gauge --;
Line 9, "became" should read -- becomes --;
Line 15, "therein whereby" should read -- therein, whereby --;
Line 53, "whereby" should read -- thereby --.

<u>Column 4,</u>
Line 11, "being" should be deleted;
Line 17, "into toward" should read -- toward --;
Line 34, "cylindrical" should read -- the cylindrical --; and "or the" should read -- or at --.

<u>Column 5,</u>
Line 37, "a demand" should read -- demand --;
Line 41, "a minute" should read -- minute --; and "reproduced" should read -- a reproduced --;
Line 49, "whereby" should read -- thereby --.

<u>Column 6,</u>
Line 18, "for" should read -- (or --;
Line 65, "whereby" should read -- thereby --.

<u>Column 7,</u>
Line 23, "the constitution" should be deleted;
Line 57, "diminish" should read -- diminishes --;
Line 64, "configured" should read -- is configured --.

UNITED STATES PATENT AND TRADEMARK OFFICE
CERTIFICATE OF CORRECTION

PATENT NO. : 6,158,382
DATED : December 12, 2000
INVENTOR(S) : Yoshio Segi et al.

It is certified that error appears in the above-identified patent and that said Letters Patent is hereby corrected as shown below:

Column 8,
Line 55, "Now, a" should read -- Now, as a --.

Column 9,
Line 21, "glow" should read -- flow --;
Line 31, "desirable" should read -- a desirable --;
Line 33, "an reproduced" should read -- a reproduced --;
Line 54, "glow" should read -- flow --;
Line 66, "other" (first occurrence) should be deleted.

Column 10,
Line 12, "number" should read -- numeral --;
Line 47, "lien" should read -- line --;
Line 58, "intersect" should read -- to intersect --;
Line 59, "to flow" should read -- flow --.

Column 11,
Line 22, "102, it is" should read -- 102 is --;
Line 26, "substrate" should read -- substrates --;
Line 52, "substrate," should read -- substrate --.

Column 12,
Line 4, "1885." should read -- 1985. --;
Line 24, "glow" should read -- flow --;
Line 46, "Preferably" should read -- Preferable --;
Line 66, "the" should read -- in the --.

Column 13,
Line 12, "film," should read -- film --;
Line 51, "The" should read -- For the --.

Column 14
Line 1, "designed" should read -- desired --;
Line 11, "deposited, film" should read -- deposited film, --;
Line 29, "being" should be deleted;
Line 53, "electrophotograph" should read -- electrophotographic --;
Line 54, "is" should be deleted.

Column 15,
Line 17, "collectivity" should read -- collectively --;
Line 33, "10%" should read -- 10%. --;
Line 51, "defect:" should read -- defects: --.

UNITED STATES PATENT AND TRADEMARK OFFICE
CERTIFICATE OF CORRECTION

PATENT NO. : 6,158,382
DATED : December 12, 2000
INVENTOR(S) : Yoshio Segi et al.

It is certified that error appears in the above-identified patent and that said Letters Patent is hereby corrected as shown below:

Column 16,
Line 5, "1)" should read -- (1) --.

Column 17,
Line 22, "place" should read -- placed --.

Column 18,
Line 4, "whose" should read -- shown --.
Line 11, "letter" should read -- latter --;
Line 45, "defect," should read -- defects, --;
Line 52, "2—2" should read -- 2-2 --.

Column 20,
Lines 15 and 53, "being" should read -- were --.

Column 21,
Line 22, "being" should read -- were --.

Column 22
Line 13, "mater" should read -- matter --;
Line 24, "reproduce" should read -- reproduces --;
Line 26, "to" should be deleted;
Table 2, "hold" should read -- hole --.

Column 23,
Table 3, " $\frac{F}{76}$ " should read -- $\frac{F}{75}$ --.

Column 24,
Table 6, "100 → 1" should read -- 100 → 0 --.

Column 25,
Table 7, "SiHi" should read -- $SiH_4$ --; and "$CO_7$" should read -- $CO_2$ --.

Column 26,
Line 55, "the both" should read -- both --.

UNITED STATES PATENT AND TRADEMARK OFFICE
CERTIFICATE OF CORRECTION

PATENT NO.    : 6,158,382
DATED         : December 12, 2000
INVENTOR(S)   : Yoshio Segi et al.

It is certified that error appears in the above-identified patent and that said Letters Patent is hereby corrected as shown below:

<u>Column 28,</u>
Line 12, "a" should read -- an --.

Signed and Sealed this

Twenty-eighth Day of January, 2003

JAMES E. ROGAN
*Director of the United States Patent and Trademark Office*